US006774752B2

(12) United States Patent
Schlenga et al.

(10) Patent No.: US 6,774,752 B2
(45) Date of Patent: Aug. 10, 2004

(54) NMR HIGH FIELD MAGNET COIL SYSTEM WITH SUPERCONDUCTING CAPABILITY AND HAVING AN OUTWARDLY PROTRUDING INNER COIL SECTION

(75) Inventors: Klaus Schlenga, Eggebsteub-L. (DE); Gerhard Roth, Rheinstetten-Mörsch (DE); Arne Kasten, Karlsruhe (DE)

(73) Assignee: Bruker Biospin GmbH, Rheinstetten (DE)

( * ) Notice: Subject to any disclaimer, the term of this patent is extended or adjusted under 35 U.S.C. 154(b) by 23 days.

(21) Appl. No.: 10/345,491

(22) Filed: Jan. 17, 2003

(65) Prior Publication Data

US 2004/0135659 A1 Jul. 15, 2004

(30) Foreign Application Priority Data

Jan. 23, 2002 (DE) ........................................ 102 02 372

(51) Int. Cl.[7] .............................. H01F 7/22; H01F 6/00
(52) U.S. Cl. ................. 335/216; 336/192; 336/DIG. 1; 505/705; 505/879; 505/211
(58) Field of Search .................................. 335/216, 299; 336/192, DIG. 1; 505/211, 704, 705, 879, 880

(56) References Cited

U.S. PATENT DOCUMENTS

| 4,213,092 A | | 7/1980 | Kneip | |
|---|---|---|---|---|
| 4,808,954 A | | 2/1989 | Ito | |
| 5,387,891 A | * | 2/1995 | Nick | ........................... 335/216 |
| 5,764,121 A | | 6/1998 | Wheatley | |
| 5,818,319 A | | 10/1998 | Crozier | |

FOREIGN PATENT DOCUMENTS

| DE | 36 88 764 | 3/1994 |
|---|---|---|
| EP | 0 207 286 | 7/1993 |
| GB | 2 386 193 | 10/2003 |
| WO | WO 01/48 767 | 7/2001 |

OTHER PUBLICATIONS

R. HaeBner "Supraleitende Magnete für die NMR–Spektroskopie", http://www.org.chemie.tu–muenchen.de/people/rh/nmrueb/magnet2.pdf.

M.N. Wilson, *Superconducting Magnets*, Oxford University Press, New York, 1983/1997k p. 318.

* cited by examiner

Primary Examiner—Ramon M. Barrera
(74) Attorney, Agent, or Firm—Paul Vincent

(57) ABSTRACT

The invention concerns an NMR (nuclear magnetic resonance) high field magnet coil system comprising superconducting conductor structures for generating a homogeneous magnetic field $B_0$ in a measuring volume (23) with several radially nested solenoidal coil sections (12, 13, 31), which is characterized in that the radially innermost coil section (31) is wound with a band-shaped superconductor with an aspect ratio (width to thickness) >3 on a coil support which axially projects, at least at one axial end, past the winding packet of the radially neighboring coil section (12) and the band-shaped superconductor is guided on this side tangentially towards the outside to a region of reduced magnetic field strength and terminates in at least one electrical connecting point (16). This permits use of a brittle band-shaped superconductor for the innermost coil system (31) which cannot be strongly bent at the upper edge.

26 Claims, 7 Drawing Sheets

NMR HIGH FIELD MAGNET COIL SYSTEM WITH SUPERCONDUCTING CAPABILITY AND HAVING AN OUTWARDLY PROTRUDING INNER COIL SECTION

This application claims Paris Convention priority of DE 102 02 372.7 filed Jan. 23, 2002 the complete disclosure of which is hereby incorporated by reference.

BACKGROUND OF THE INVENTION

The Invention concerns an NMR (nuclear magnetic resonance) high field magnet coil system comprising superconducting conductor structures with several solenoid-shaped radially nested coil sections for generating a homogeneous magnetic field $B_0$ in a measuring volume.

An arrangement of this type is known e.g. from the manual of the TU Munich "Supraleitende Magnete für die NMR-Spektroskopie", http://www.org.chemie.tu-muenchen.de/people/rh/nmrueb/magnet2.pdf (status: 21.12.2001) by Rainer Haeßner.

An alternative construction of an NMR high field magnet coil arrangement in pancake arrangement is disclosed in Martin N. Wilson, *Superconducting Magnets*, Oxford University Press, New York, 1983/1997, page 318.

Nuclear magnetic resonance (NMR) spectroscopy is currently of great importance for structural examination in chemistry and solid-state physics and also in medical diagnostics for measurement of the spatial density distribution of certain atoms, e.g. protons in living tissue to supplement and extend X-ray diagnostics (Nuclear Magnetic Resonance Tomography or Magnetic Resonance Imaging).

In NMR, maximum magnetic field strengths are usually desired in a measuring volume with simultaneous maximum homogeneity and temporal stability. All these factors decisively contribute to the resolution capability of the NMR measurement.

High magnetic field strengths can be obtained through use of superconducting magnet coil systems. Electrical currents of up to a few hundred amperes, which produce magnetic fields on the order of a few Tesla, flow with almost no loss in the superconducting coils which are short-circuited during operation via a superconducting bridge.

The homogeneity and stability of the magnetic fields is obtained through additional external compensation coils, so-called shim coils, and also through as symmetrical a structure of the magnet arrangement as possible. The shim coils can also be designed as superconductors.

When superconductors are used, one must take into account the fact that superconductors undergo a transition into the normally conducting state above certain temperatures, electrical currents and magnetic field strengths which depend on the material used. The critical maximum of any parameter thereby depends on the size of the two other parameters.

Since 1986, so-called high-temperature superconductors (HTS) are available which have higher transition temperatures and higher critical magnetic field strengths than conventional (in particular metallic) superconductors. HTS materials are therefore preferably used for the inner coil sections of magnet coil systems, since the largest magnetic field strengths act at that location.

HTS materials generally have ceramic properties and are therefore difficult to process due to low ductility and low breaking strength. The HTS must usually be produced in the shape in which it is used. In particular, strong bends (kinks) in the superconducting structure are problematic and can considerably reduce the current carrying capability of the superconductor. Minimum possible radii of curvature are therefore given for these brittle superconductors which must be taken into consideration for the application at hand.

Another problem arises when the superconductors are to be electrically connected, in particular when connecting two partial superconducting sections of a conductor arrangement. A superconducting solder is used at the contacting points, the so-called joints, which however usually has a lower critical magnetic field strength than the other superconducting material. The fields of application of the arrangement is limited by the solder unless the joints can be disposed in a region of lower magnetic field strength than the main part of the superconducting arrangement.

The Pancake magnetic coil arrangement described by Wilson loc. cit., which is based on a tape winding technology, leaves the joints in the high field region and the solder limits the maximum achievable magnetic field strength such that use of HTS materials in this arrangement is not reasonable.

In the arrangement of MAGNEX as described by Haeßner, loc. cit., the joints of the radially nested solenoidal coil sections are drawn into the low field region. However, in the geometry shown, the superconductor must be extracted parallel to the winding axis, i.e. perpendicular to the winding direction. This requires a bend of approximately 90° in the conductor path of the superconductor as a result of which, the required minimum admissible bending radius of the coil material is not determined by the coil radius but by the bend in the conductor path. For this reason, ceramic HTS materials cannot be used in this arrangement, since their minimum bending radius is excessively large.

In contrast thereto, it is the object of the present invention to provide for use of a brittle, band-shaped superconductor in the innermost coil system which is incapable of being bent to such a large extent at the upper edge of the system.

SUMMARY OF THE INVENTION

In accordance with the invention, this object is achieved in a surprisingly simple and effective fashion in that the radially innermost coil section is wound with a band-shaped superconductor, having an aspect ratio (width to thickness) >3, onto a coil support which, at least at one axial end, projects in an axial direction past the winding packet of the radially neighboring coil section, wherein the band-shaped superconductor is tangentially, outwardly guided at that end into a region of reduced magnetic field strength to terminate in at least one electrical connecting point.

The superconductor can therefore be guided from the high field region of the magnet arrangement without substantial bend and contacting of the superconductor can be effected by the solder without impairing the maximum magnetic field strength. The magnet arrangement with radially nested solenoidal coil sections is therefore also easy to realize using brittle ceramic superconductors, which include the known HTS materials.

In a particularly advantageous embodiment of the inventive magnet coil system, the band-shaped superconductor contains high-temperature superconducting (HTS) material. This produces considerably higher magnetic field strengths and the resolution of an associated NMR measuring means can be considerably increased.

In one particularly advantageous embodiment, the at least one electrical connecting point in which the tangentially outwardly directed band-shaped superconductor terminates, is superconducting. This connecting point is subjected to a lower magnetic field strength than the main part of the coil such that the superconducting solder which is usually used does not limit the applications of the arrangement, in particular the maximum magnetic field strength.

In a preferred further development of this embodiment, the electrical connecting point is a superconducting switch to facilitate charging of the magnet coil arrangement.

In one further particularly preferred embodiment of the magnet arrangement, at least one of the electrical connecting points connects different superconducting materials to permit change of the superconducting material within the circuit, in particular, to an easily handled, ductile metallic superconductor.

In one additional advantageous embodiment, the band-shaped superconductor is returned from the electric connecting point to the magnet coil thereby permitting more winding layers or larger winding lengths and therefore higher magnetic field strengths.

In one advantageous embodiment of the magnet arrangement, the other axial end of the coil support of the radially innermost coil section does not project axially past the winding packets of the remaining coil sections of the magnet coil system. This reduces the overall height of the system and saves material.

In one particularly preferred embodiment of the inventive magnet arrangement, the radially innermost coil section is wound in the axial direction in an asymmetric manner relative to the magnetic center of the outer coil sections in such a fashion as to maintain the homogeneity of the overall magnetic field required for an NMR high field magnet coil system. This obviates the need for further additional correction coils for field homogenization.

In one particularly advantageous embodiment, the winding layers of the radially innermost coil section having the band-shaped superconductor tangentially guided at one axial end outwardly towards a region of reduced magnetic field strength, have an axially varying winding density. The magnet coil arrangement in accordance with prior art with outer coil sections each projecting past the neighboring inner coil sections (see Haeβner, loc. cit.) has the advantage of high magnetic field homogeneity in the center of the arrangement. This geometry is lost by the inventive protrusion of the innermost coil section. The inventive variation of the winding density, in particular a reduction in the winding number in the projecting region, can keep the resulting disturbance low.

In a further advantageous embodiment of the inventive magnetic field arrangement, the band-shaped superconductor is precisely guided through specially formed spacers having the same height as the band-shaped superconductor. After a layer is completely wound, this produces a uniform cylindrical surface as a basis for further possible windings.

In another advantageous embodiment, the parts of the band-shaped superconductor which are tangentially outwardly guided into a region of reduced magnetic field strength and optionally inwardly, tangentially returned from that location are guided through groove-like depressions on the surfaces of the coil support of the radially innermost coil section. This fixes the position of the superconductor such that the forces on the conductor (i.e. the Lorenz forces in the magnetic field) cause no change in the conductor geometry which would, in turn, cause a magnetic field change.

In an advantageous further development of this embodiment, the groove-like depressions are directly integrated in the coil support for defined guidance of the band-shaped superconductor of the radially innermost winding layer in a particularly simple and mechanically highly stable fashion.

In another further development, flexible mats with depressions for defined guidance of the neighboring winding layer(s) of the band-shaped superconductor are disposed between the winding layers of the band-shaped superconductor of the radially innermost coil section to permit mechanical fixing of several winding layers.

In an alternative further development, two folded together partial shells with depressions for defined guidance of the neighboring winding layer(s) of the band-shaped superconductor are disposed between each winding layer of the band-shaped superconductor of the radially innermost coil section to also permit mechanical fixing of several winding layers.

In one further particularly advantageous development, the groove-like depressions in the surfaces of the coil support or in the underlying mats or partial shells have saw-toothed cross-sections. The band-shaped superconductor can thereby be held in the guidance when subjected to forces and without changing shape, despite the pitch of the coil winding along the coil axis. The applied forces are directed largely normal to the surface of the band to keep mechanical loading of the band at a minimum.

In another advantageous embodiment of the inventive magnet arrangement, the cross-section of the coil support of the radially innermost coil section extends in an axially variable manner, in particular conically. This also contributes to maintaining the homogeneity of the magnetic field close to the center which is disturbed by the projecting innermost coil section.

In a further advantageous embodiment, the electrical connecting points are uniformly and azimuthally distributed thereby rendering the disturbances of the magnetic field caused by the connecting points symmetrical to largely maintain the homogeneity of the magnetic field.

In another advantageous embodiment, the electrical connecting points are azimuthally adjacent. Magnetic field disturbances of the connecting points are thereby limited to a confined spatial region.

In a particularly advantageous embodiment of the inventive magnet arrangement, the minimum admissible bending radius of the band-shaped superconductor is of the same order of magnitude as the radius of the coil support of the radially innermost coil section. The coil geometry is thereby optimally adjusted to the brittle superconducting material used such that the advantages of the invention, in particular the use of brittle HTS materials in the inventive coil geometry, is optimally utilized for generating maximum magnetic field strengths.

This is particularly significant in one advantageous embodiment with which the magnet coil system is designed to produce a magnetic induction strength>20 T to further improve the resolution in NMR measurements.

In a further advantageous embodiment of the inventive magnet arrangement, the operating temperature is approximately equal to or smaller than 4 K, in particular approximately 2 K. This low operating temperature permits use of high magnetic field strengths so that the advantage of the inventive geometry which, i.a. displaces the joints to a region of a low magnetic field strength, is fully utilized.

In a further embodiment of the inventive magnet arrangement, all coil sections are connected in series. This connection is particularly simple.

In another embodiment, all sections are in a constant current mode during operation.

In a further advantageous embodiment of the inventive magnet arrangement, all sections having no HTS are connected in series to electrically combine one part of the coil arrangement in a reasonable and simple fashion.

In one further development, a device is provided to operate the section containing the HTS with a separate power supply. This power supply can be matched to the requirements of this particular section.

Further advantages of the invention can be extracted from the description and the drawing. The features mentioned above and below can be used in accordance with the invention individually or collectively in any arbitrary combination. The embodiments shown and described are not to be understood as exhaustive enumeration but rather have exemplary character for illustrating the invention.

The invention is shown in the drawing and explained in more detail by means of embodiments.

DESCRIPTION OF THE PREFERRED EMBODIMENT

Figure 1:
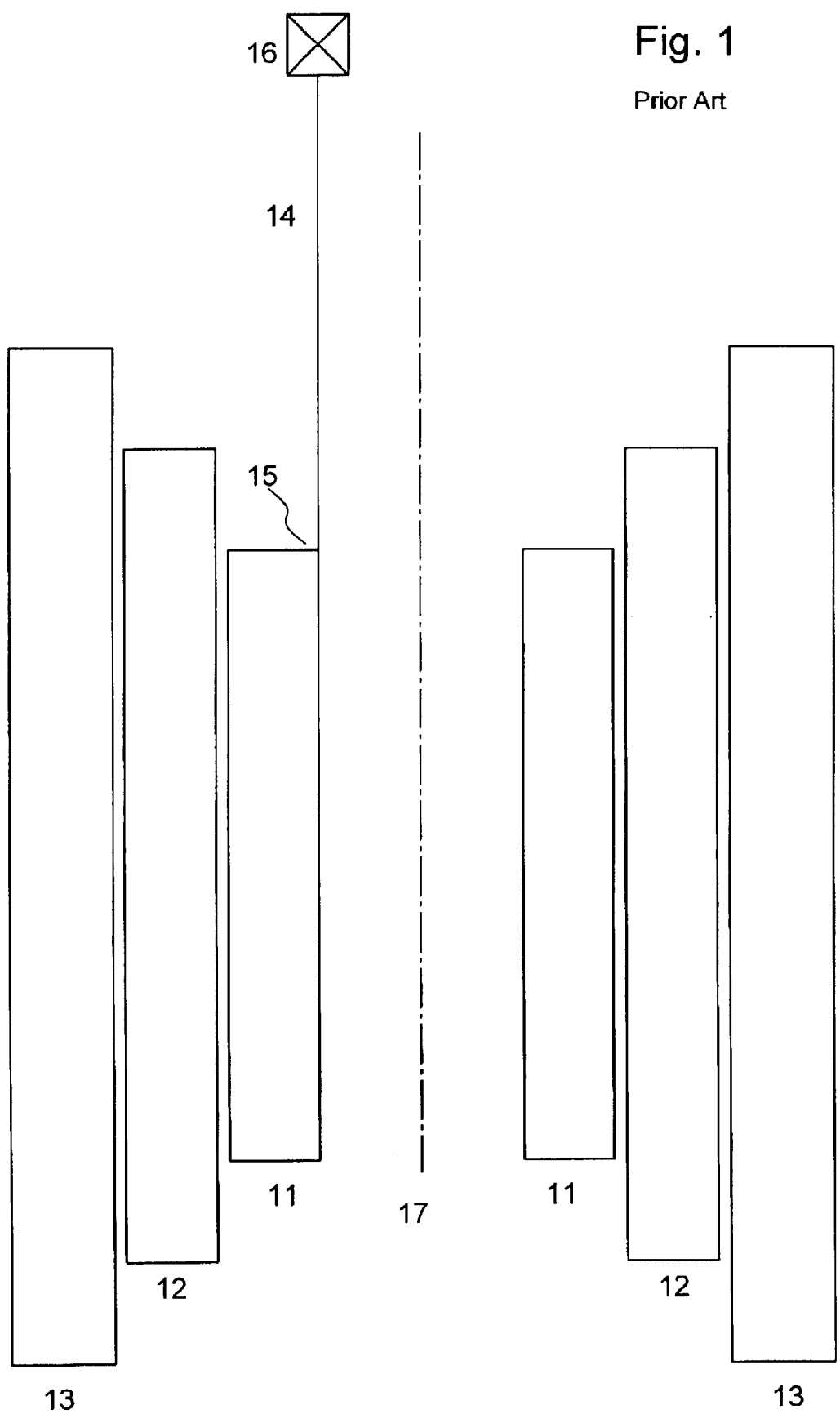
FIG. 1 shows a schematic representation of a nested solenoidal magnet coil arrangement and its contacts in accordance with prior art.

FIG. 1 schematically shows conventional contacting of nested solenoldal magnet coil systems. Several outer coil sections 12, 13 project past an innermost coil section 11, wherein the coil sections 12, 13 disposed further outside project past the respective neighboring inner coil sections 11, 12. All three coil sections 11–13 are oriented on a common winding axis 17. For contacting the innermost superconducting coil section 11, a superconducting line 14 of the coil material is passed out of the region of high magnetic field strengths so that a joint 16 comprising a different material is only exposed to small magnetic field strengths. A superconducting solder with lower critical magnetic field strength than that of the coil material can be used for the contact. The superconducting line 14 is guided out, parallel to the winding axis 17, i.e. perpendicular to the winding direction (see Haeβner loc. cit.). The superconducting coil material must therefore be bent through approximately 90°. The required minimum admissible radius of curvature of the coil material is determined, in this case, by the bending radius at the bend 15 between the edge of the innermost coil section 11 (along which the last winding loop approximately extends) and the superconducting line 14.

Figure 2:
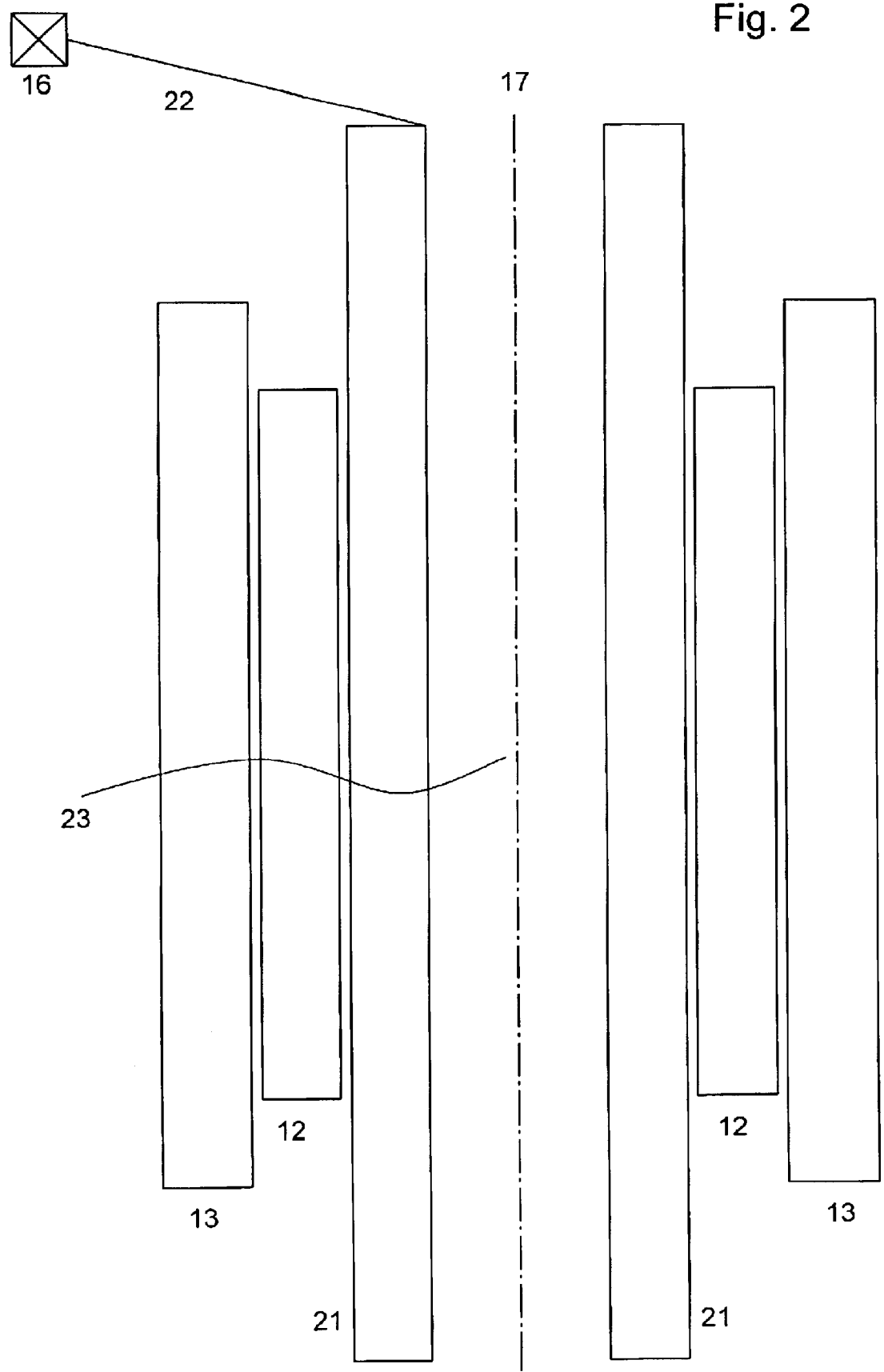
FIG. 2 shows a schematic representation of an inventive nested solenoidal magnet coil arrangement with the innermost coil section projecting at both ends.

FIG. 2 shows the inventive arrangement of a nested solenoidal magnet coil arrangement, wherein an innermost coil section 21 which experiences the highest magnetic field strengths projects, on both ends, past the magnet coil sections 12, 13 which are disposed further outside. A superconducting line 22 can therefore be guided away from the innermost coil section 21 against the winding direction of the coil and without significant bend. The required minimum admissible radius of curvature of the coil material is then determined by the coil radius. The symmetrical projection of the innermost coil section 21 on both sides of the magnet arrangement minimizes the inhomogeneity of the magnetic field in the center of the magnet arrangement, in particular in a sample region 23.

Figure 3:
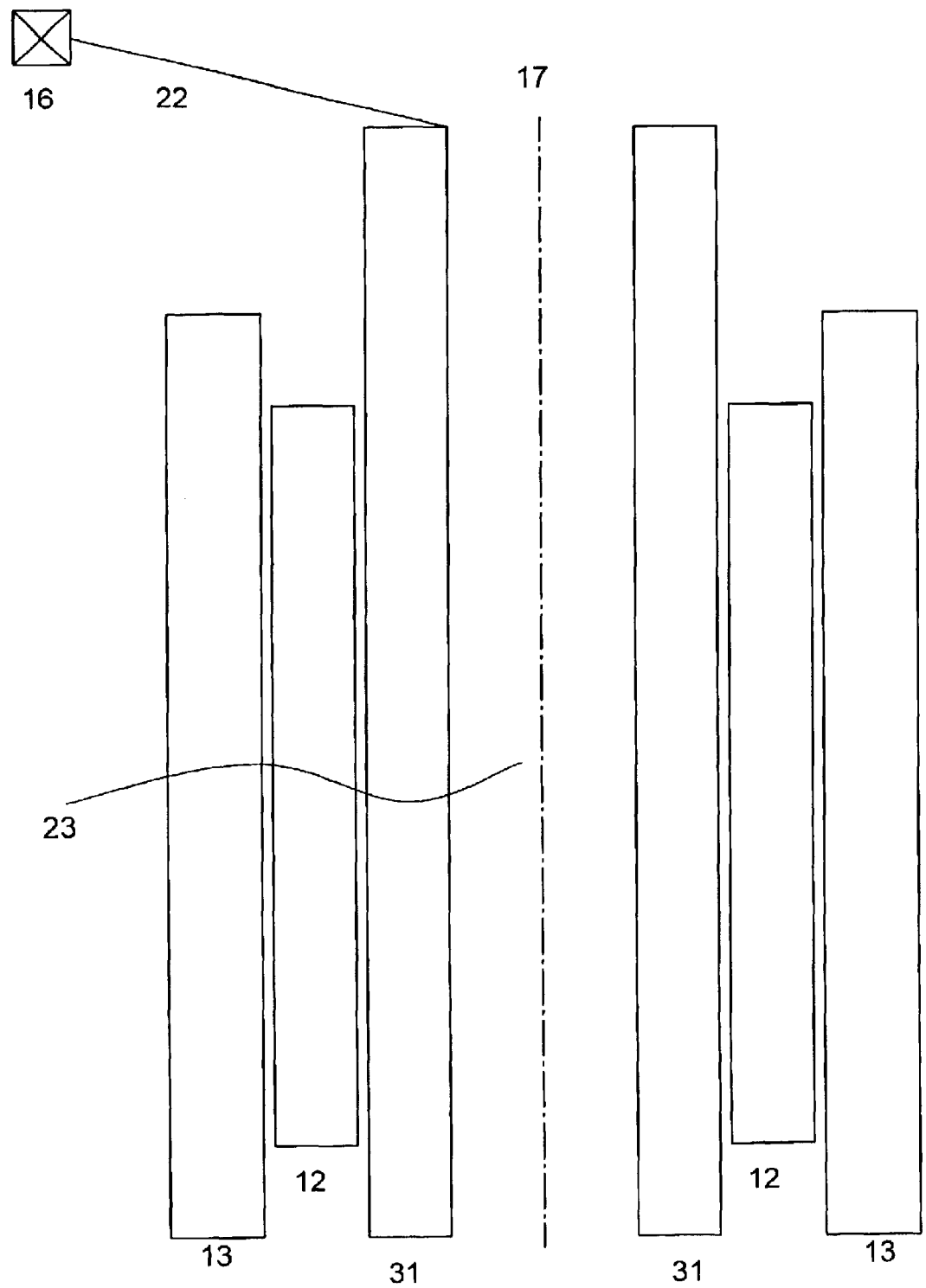
FIG. 3 shows a schematic representation of an inventive nested solenoidal magnet coil arrangement with the innermost coil section projecting at one end.

FIG. 3 shows an inventive variant of the arrangement of FIG. 2, wherein an innermost coil section 31 projects past the outermost coil 13 on one side only. This construction requires less space than the embodiment of FIG. 2 but leads to asymmetries in the magnetic field along the coil axis 17.

Figure 4:
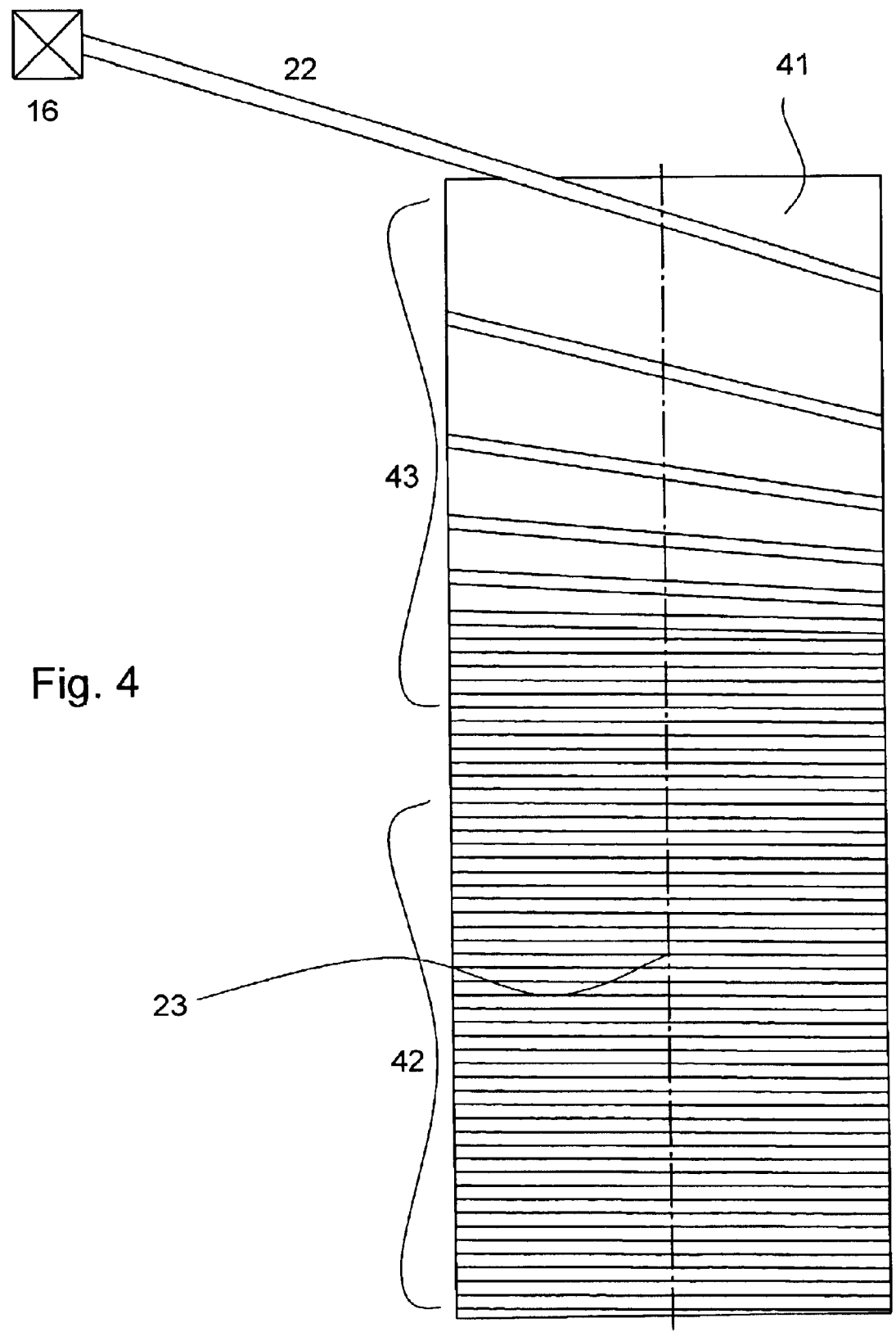
FIG. 4 shows a schematic representation of a solenoidal magnet coil with variable winding density in accordance with the invention.

FIG. 4 shows a schematic representation of the innermost coil section 31 of a magnet arrangement which has an inventive, variable winding density along the coil axis 17 for compensating the magnetic field asymmetry. The windings, wound onto a winding body 41, are divided into two regions. One region of tightly wound, uniform windings 42 is disposed in the vicinity of the sample region 23 and generates the highest magnetic fields in the sample region 23. The coil maps into a region of decreasing winding density 43 in the direction towards the connection point 16. A weaker magnetic field is generated in the region of decreasing winding density 43 compared to a comparable region of tightly wound uniform windings 42. The region of decreasing winding density 43 can extend, in the extreme case, along the entire innermost coil section 31 or at least through partial regions thereof. This minimizes the magnetic field asymmetry in the sample region 23 which is caused by the unilateral protrusion of the innermost coil section 31.

Figure 5:
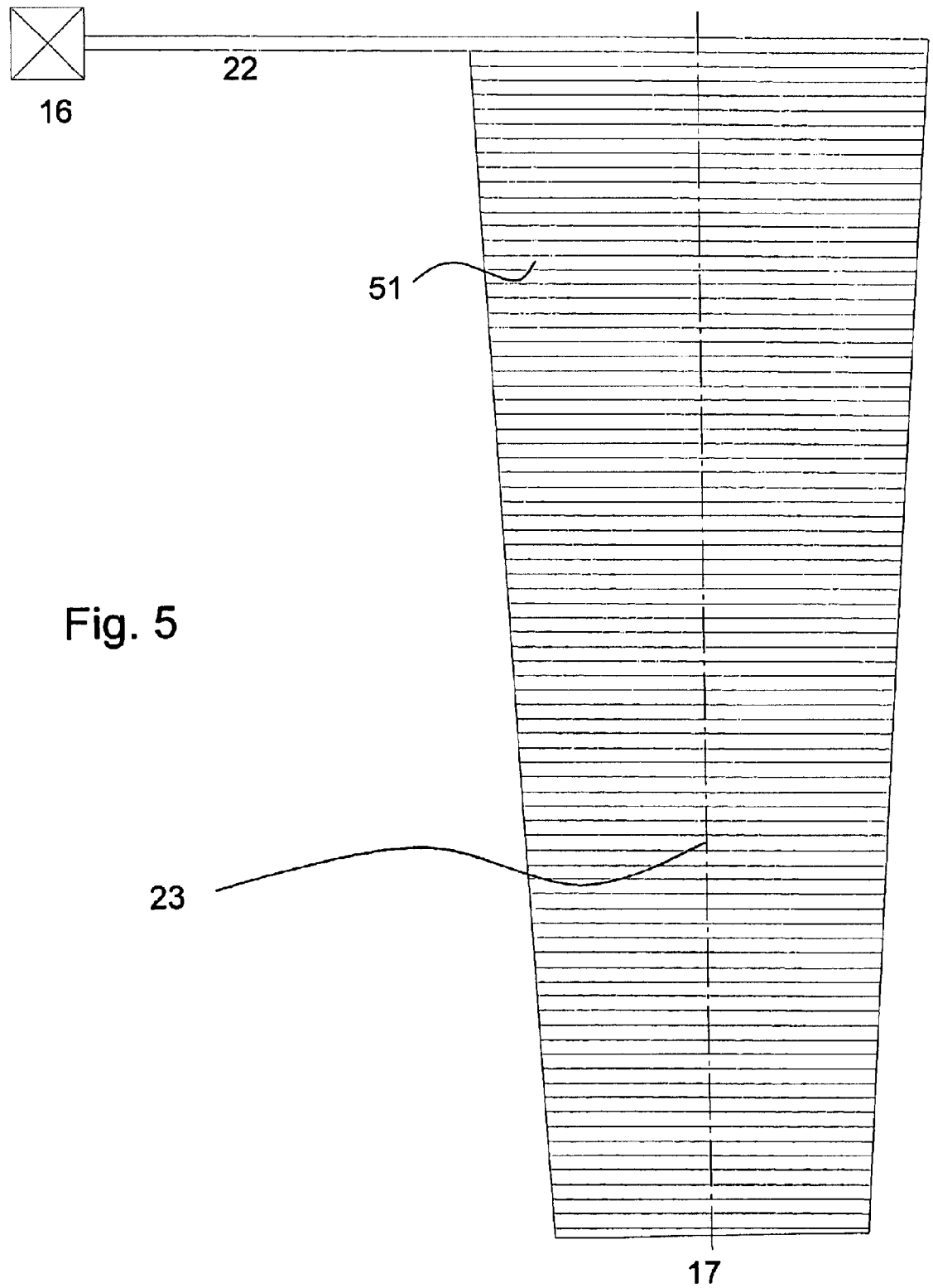
FIG. 5 shows a schematic representation of a solenoidal magnet coil with variable cross-section of the coil support in accordance with the invention.

FIG. 5 shows a schematic representation of the innermost coil section 31 of a magnet arrangement whose associated coil support 51 has an axially variable cross-section along the coil axis 17 to compensate for the asymmetry in the magnetic field. In accordance with the Biot-Savart Law, the uniformly dense winding of the coil in the embodiment shown produces a smaller magnetic field contribution in the region of the large cross-section of the coil support 51 close to the connecting point 16, i.e. in the region of the protrusion past the outermost coil section 13, than in the region of the smaller cross-section in the vicinity of the sample region 23. The magnetic field asymmetry in the sample region 23 which is produced by the unilateral projection of the Innermost coil section 31 is also minimized.

Figure 6:
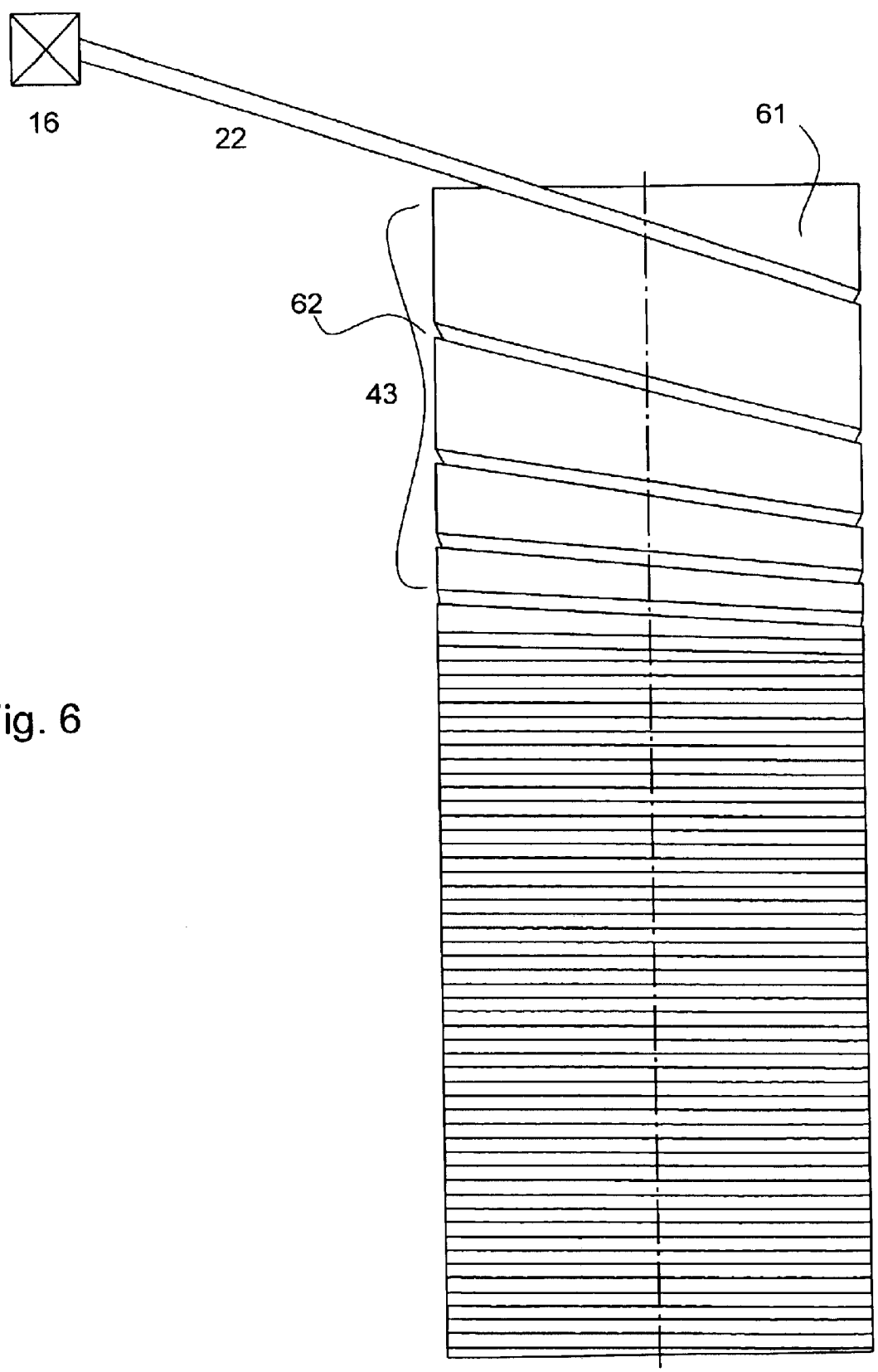
FIG. 6 shows a schematic representation of a solenoidal magnet coil with inventive saw-tooth shaped groove-like depressions for guiding the band-shaped superconductor.

FIG. 6 schematically shows the innermost coil section 31 of a magnet arrangement which has a variable winding density along the winding axis 17 (see FIG. 4). In the region of decreasing winding density 43, the band-shaped superconductor is guided through groove-like, saw-tooth shaped depressions 62 in the surface of the coil support 61 and fixed thereby. The steepness of the saw-tooth profile is adapted to the pitch of the winding spiral such that the band-shaped superconductor is always flatly supported in its guidance. This reduces the mechanical tensions in the superconductor under the influence of loads, e.g. caused by Lorenz forces.

Figure 7:
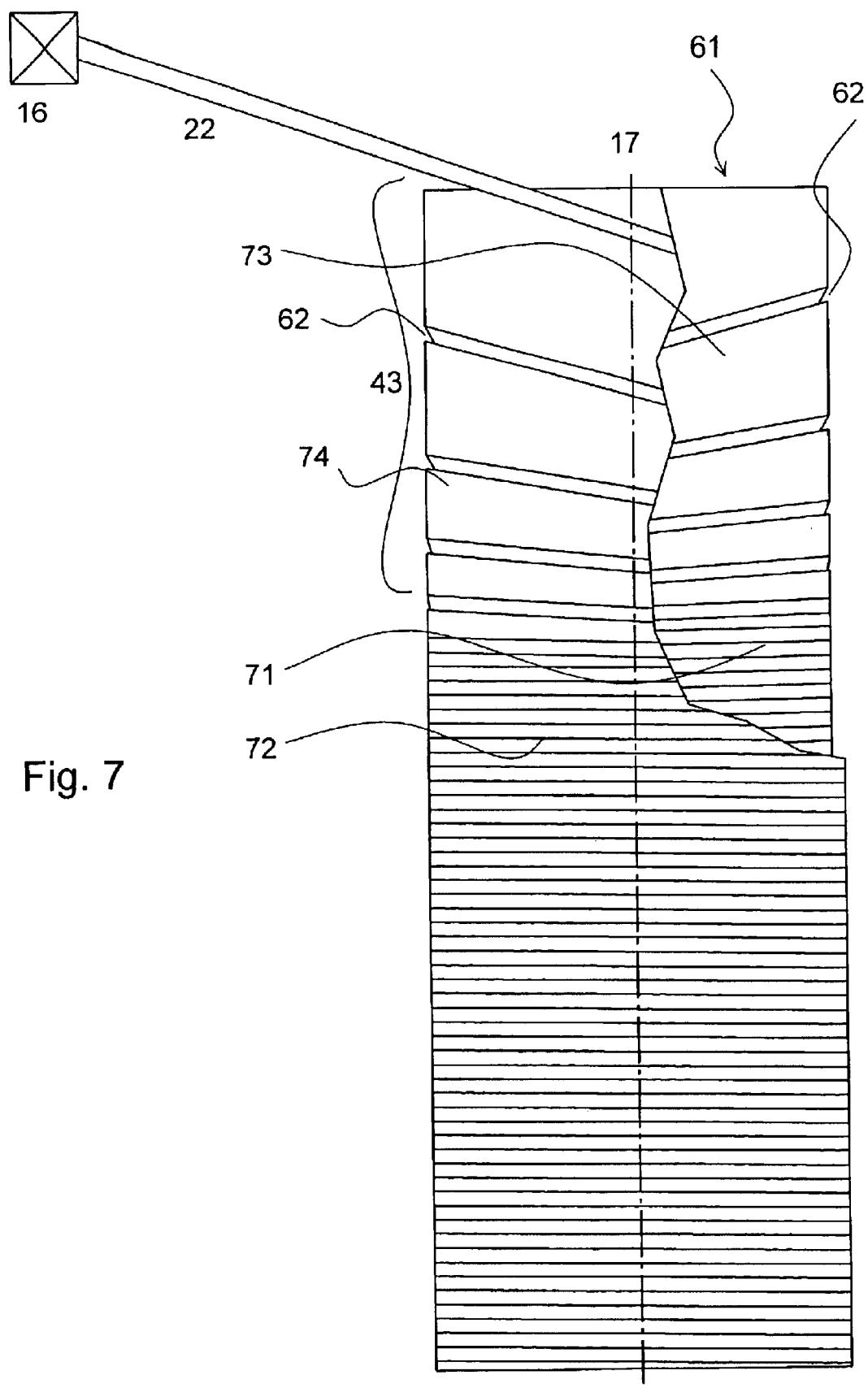
FIG. 7 shows a schematic representation of a solenoidal magnet coil with two winding layers and inventive guidance of the band-shaped superconductor.

FIG. 7 shows the schematic structure of the innermost coil section 31 of a magnet arrangement which has, analog to the embodiment of FIG. 6, a region of varying winding density 43 and saw-toothed depressions 62 for guiding the band-shaped superconductor and having two winding layers 71 and 72. In the region where the inner winding layer 71 has a region of reducing winding density 43, the saw-toothed depressions 62 are separated by inventive intermediate pieces 73 which define the saw-toothed depressions 62 and form a nearly flat support surface for the upper winding layer 72. The upper winding layer 72 is also provided with inventive intermediate pieces 74 which can again serve as support surface for a third winding layer (not shown). The intermediate pieces 73 and 74 can be formed as flexible mats or folded partial shells. When the saw-toothed depressions 62 of the innermost winding layer 71 are worked directly into the coil support 61, the intermediate pieces 73 of the innermost winding layer 71 may also be part of the coil support 61 itself.

We claim:

1. An NMR (nuclear magnetic resonance) high field magnet coil system having superconducting conductor structures for generating a homogeneous magnetic field $B_0$ in a measuring volume by means of several, radially nested solenoid coil sections, the coil system comprising:

a first solenoid coil section having a winding packet; a coil support disposed radially neighboring and nested within said first solenoid coil section, said coil support having at least one axial end which projects past said winding packet of said first solenoid coil section;

means for electrical connection, said electrical connection means disposed outwardly from said radially nested solenoid coil sections in a region of reduced magnetic field strength; and a band-shaped superconductor having a width to thickness aspect ratio>3, said band-shaped superconductor wound on said coil support to define a radially innermost coil section, said band-shaped superconductor outwardly passed in a tangential fashion at said axial end of said coil support to cooperate with said electrical connection means.

2. The magnet system of claim 1, wherein said band-shaped superconductor contains high temperature superconducting (HTS) material.

3. The magnet system of claim 1, wherein said electrical connection means is superconducting.

4. The magnet system of claim 3, wherein said electrical connection means is a superconducting switch.

5. The magnet system of claim 1, wherein at least one of said electrical connection means connects differing superconducting materials.

6. The magnet system of claim 1, wherein said band-shaped superconductor is passed from said electrical connection means back to said coil support.

7. The magnet system of claim 1, wherein said coil support of said radially innermost coil section has a second end which does not project axially past winding packets of other coil sections of the magnet coil system.

8. The magnet system of claim 1, wherein said radially innermost coil section is wound in an axial direction asymmetrically relative to a magnetic center of outer coil sections in such a manner as to maintain homogeneity of a generated overall magnetic field required for the NMR high field magnet coil system.

9. The magnet system of claim 1, wherein a winding density of said band-shaped superconductor axially varies in winding layers of said radially innermost section.

10. The magnet system of claim 1, wherein said coil support has means for defining spacers, said spacers disposed at a same height as said band-shaped superconductor to precisely guide said band-shaped superconductor.

11. The magnet system of claim 1, wherein parts of said band-shaped superconductor are guided through groove-like depressions on surfaces of said coil support of said radially innermost coil section.

12. The magnet system of claim 11, wherein said groove-like depressions are directly integrated in said coil support.

13. The magnet system of claim 10, wherein said spacer defining means comprise flexible mats having depressions for defined guidance of neighboring winding layers of said band-shaped superconductor, said mats disposed between winding layers of said band-shaped superconductor of said radially innermost coil section.

14. The magnet system of claim 10, wherein said spacer defining means comprise two folded partial shells having depressions for defined guidance of neighboring winding layers of said band-shaped superconductor, said shells disposed between each winding layer of said band-shaped superconductor of said radially innermost coil section.

15. The magnet system of claim 10, wherein said spacer defining means have saw-toothed cross-sections.

16. The magnet system of claim 1, wherein a cross-section of said coil support of said radially innermost coil section extends in one of an axially variable and conical fashion.

17. The magnet system of claim 1, wherein said electrical connection means are uniformly azimuthally distributed.

18. The magnet system of claim 1, wherein said electrical connection means are azimuthally disposed in mutual proximity to another.

19. The magnet system of claim 1, wherein a minimum admissible bending radius of said band-shaped superconductor is on an order of magnitude of a radius of said coil support of said radially innermost coil section.

20. The magnet system of claim 1, wherein the magnet coil system is designed to generate a magnetic induction strength>20 T.

21. The magnet system of claim 1, wherein the magnet system has an operating temperature which is approximately smaller than or equal to 4 K.

22. The magnet system of claim 21, wherein the magnet system has an operating temperature which is approximately smaller than or equal to 2 K.

23. The magnet system of claim 1, wherein all coil sections are connected in series.

24. The magnet system of claim 1, wherein all coil sections are in a constant current mode during operation.

25. The magnet system of claim 1, wherein all coil sections which contain no HTS are connected in series.

26. The magnet system of claim 25, further comprising means for operating a coil section containing HTS using a separate power supply.

* * * * *